United States Patent [19]

Cooke et al.

[11] Patent Number: 5,641,969
[45] Date of Patent: Jun. 24, 1997

[54] ION IMPLANTATION APPARATUS

[75] Inventors: Richard H. Cooke, Storrington; John J. Perrins, Crawley Down; Stephen G. Young, Shoreham, all of England

[73] Assignee: Applied Materials, Inc., Santa Clara, Calif.

[21] Appl. No.: 626,746

[22] Filed: Mar. 28, 1996

[51] Int. Cl.⁶ .............................. H01J 37/20; H01J 37/317
[52] U.S. Cl. .................................. 250/492.21; 250/442.11
[58] Field of Search ............................. 250/492.21, 442.11

[56] References Cited

U.S. PATENT DOCUMENTS

| | | | |
|---|---|---|---|
| 4,733,091 | 3/1988 | Robinson et al. | 250/492.21 |
| 4,899,059 | 2/1990 | Freytsis et al. | 250/492.21 |
| 5,525,807 | 6/1996 | Hirokawa et al. | 250/492.21 |

*Primary Examiner*—Jack I. Berman
*Attorney, Agent, or Firm*—Lawrence Edelman

[57] ABSTRACT

Ion implantation apparatus has an implant wheel in a vacuum chamber. The implant wheel has a number of circumferentially distributed wafer holding positions and is arranged to spin so that the wafers successively intercept an ion beam. The implant wheel is mounted at the free end of a scanning arm which itself is mounted for reciprocating movement on a wall of the vacuum chamber by means of a rotary vacuum seal. A wheel drive motor is mounted in the vacuum chamber on the rotational axis of the implant wheel and the wheel and drive motor combination can be tilted at the end of the scanning arm to adjust the angle of implantation. The tilt actuator is inside the vacuum chamber mounted on the scanning arm and the tilt axis is such that the axis of rotation of the implant wheel remains always in the same plane as the axis of scan of the scanning arm.

11 Claims, 7 Drawing Sheets

5,641,969

ION IMPLANTATION APPARATUS

FIELD OF THE INVENTION

The invention relates to ion implantation apparatus. Such apparatus is used for implanting ions of preselected chemical species into semiconductor wafers for manufacturing desired semiconductor electronic devices. The present invention is particularly concerned with apparatus for scanning semiconductor wafers under treatment relative to the ion beam to ensure an even dose of ions is delivered to all parts of the wafer.

BACKGROUND OF THE INVENTION

In one form of ion implantation apparatus, wafers for treatment are mounted at a number of discreet positions around the periphery of an implant wheel. The wheel is mounted at the free end of a scanning arm which is mounted at its other end for reciprocating motion about a scanning axis. The scanning arm and implant wheel are located in a vacuum chamber to which a beam of desired ions is directed from an ion source. As the wheel rotates at the end of the scanning arm, the various wafers mounted around the periphery of the wheel are brought successively in front of the beam. At the same time, the scanning arm more slowly moves the axis of rotation of the wheel to and fro, so that the ion beam is progressively scanned over the whole surface of the wafers.

Apparatus of this kind is known from U.S. Pat. No. 4,733,091 and U.S. Pat. No. 4,899,059.

In U.S. Pat. No. 4,733,091, the scanning arm of the apparatus is mounted for reciprocating movement by means of a rotary vacuum seal on the scan axis of the scanning arm. The implant wheel is driven by means of drive shafts and belts from outside the vacuum chamber, with the drive belts extending the length of the scanning arm to drive the shaft of the implant wheel rotatably mounted at the free end of the scanning arm.

In U.S. Pat. No. 4,899,059, the implant wheel is driven directly by an electric motor mounted at the end of the scanning arm within a sealed housing inside the vacuum chamber. The scanning arm of the '059 patent is mounted for reciprocating motion about an axis located outside the vacuum chamber. This scan axis is parallel to the adjacent wall of the vacuum chamber so that a bellows-type seal is necessary between the scanning arm and the wall of the vacuum chamber through which it extends, in order to accommodate the movement of the scanning arm. This construction is necessary in this patent because the implant wheel can be rotated between an implant position with the plane of the wheel substantially vertical and a wafer loading position with the plane of the wheel substantially horizontal, about an axis which is essentially coaxial with the scanning arm. The implant wheel is driven between the loading and implant positions by a motor located outside the vacuum chamber driving a shaft extending through the bellows-type seal.

The use of a bellows-type seal to accommodate the complex motion of the scanning arm relative to the vacuum chamber wall, in the '059 patent, can give rise to problems.

Furthermore, in the '059 patent, the angle of tilt of the implant wheel relative to the ion beam during implantation can be set to provide a desired angle of implantation. This is achieved by manually adjusting the rotational position relative to the tilt axis of the entire scanning arm and drive mechanism. The bellows-type seal must also accommodate this motion.

It is an object of the present invention to provide improved ion implantation apparatus which enables the angle of tilt of the implant wheel to be set remotely and which provides all the facilities of known implantation apparatus with improved sealing arrangements and simpler and more reliable construction.

SUMMARY OF THE INVENTION

According to the present invention ion implantation apparatus comprises:

a) a vacuum chamber, b) an ion beam generator to generate an ion beam in the vacuum chamber, c) an implant wheel, in the vacuum chamber, having a plurality of circumferentially distributed substrate holding positions, d) a scanning arm mounted for reciprocal movement about a scan axis and having a free end supporting said implant wheel for rotation about a wheel axis, so that rotation of said implant wheel about said wheel axis brings the substrate holding positions successively to intercept the ion beam and reciprocation of said scanning arm about said scan axis scans the ion beam across the substrate holding positions, e) a rotary vacuum seal on said scan axis to mount said scanning arm for said reciprocating movement, f) a scan arm drive motor mounted outside said vacuum chamber to drive said scan arm through said rotary vacuum seal on said scan axis, g) a wheel bearing carrying said implant wheel for rotation about said wheel axis, h) a wheel tilt mechanism located in said vacuum chamber and including a tilt bearing mounting said wheel bearing to said free end of the scanning arm such that said wheel axis can be tilted relative to said scanning arm about a tilt axis, and a tilt actuator operable to set the wheel axis to a desired angle of tilt, and i) a wheel drive motor mounted in the vacuum chamber coaxially with said wheel.

In a preferred arrangement, said tilt bearing is such that said tilt axis is perpendicular to said wheel axis. More preferably, said tilt bearing is such that said wheel axis is always in the same plane as said scan axis, said tilt axis being perpendicular to said plane. With this arrangement, the tilt axis is conveniently generally perpendicular to the length of the scanning arm.

In a preferred embodiment, said wheel bearing has an outer bearing housing and said wheel drive motor has an outer motor housing fixed relative to said outer bearing housing. Thus, the wheel drive motor tilts with the implant wheel.

Said outer motor housing may define a sealed motor enclosure for the motor stator and rotor, and the apparatus then includes a gas duct connecting said sealed motor enclosure to atmosphere. In this way, the possibility of contamination of the vacuum within the vacuum chamber from the operation of the motor is eliminated.

Said motor enclosure gas duct connects to atmosphere through said rotary vacuum seal on said scan axis. Conveniently, said gas duct comprises a discreet pipe located adjacent to and extending the length of said scanning arm, said duct having a flexible coupling to said motor enclosure.

Preferably, said tilt bearing is arranged to provide said tilt axis substantially intersecting said wheel axis.

Said tilt actuator may comprise a linear actuator mounted in the vacuum chamber between a first point on said scanning arm between said scan axis and said tilt axis and a second point fixed relative to said wheel bearing at a location spaced from said tilt axis in a direction normal to the line of action of said linear actuator.

Said linear actuator may comprise an electric actuator motor driving a roller screw on a threaded rod, an actuator housing defining a sealed actuator enclosure for said actuator motor and said nut, and a gas duct connecting said sealed actuator enclosure to atmosphere.

Said actuator enclosure gas duct may connect to atmosphere through said rotary vacuum seal on said scan axis.

BRIEF DESCRIPTION OF THE DRAWINGS

An example of the present invention will now be described with reference to the accompanying drawings in which.

DETAILED DESCRIPTION OF THE PREFERRED EMBODIMENT

Figure 1:
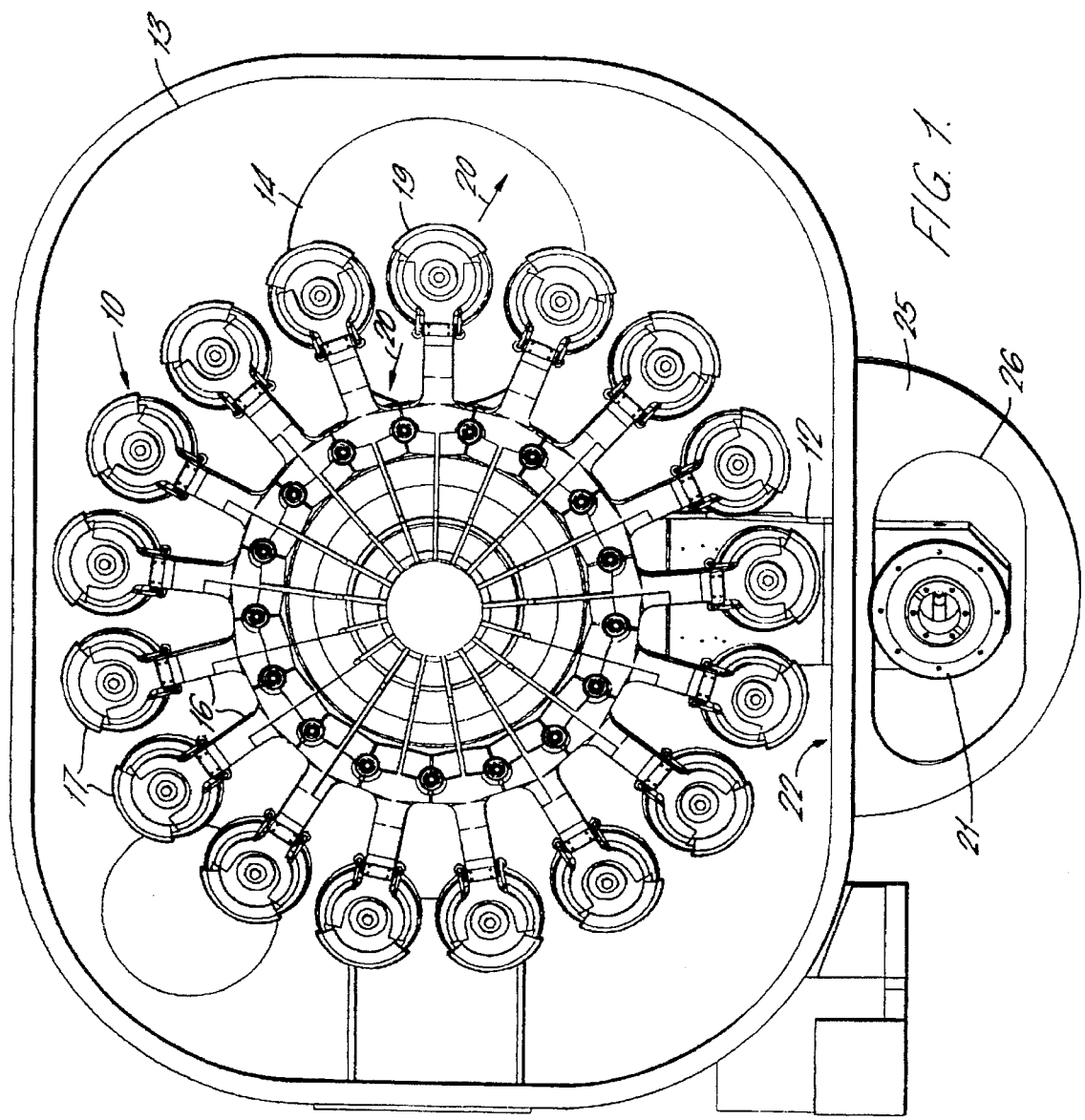
FIG. 1 is a front view in elevation of an implant wheel for an implantation apparatus, mounted within a vacuum chamber, the rear door of the vacuum chamber being removed for illustration purposes.
Figure 2:
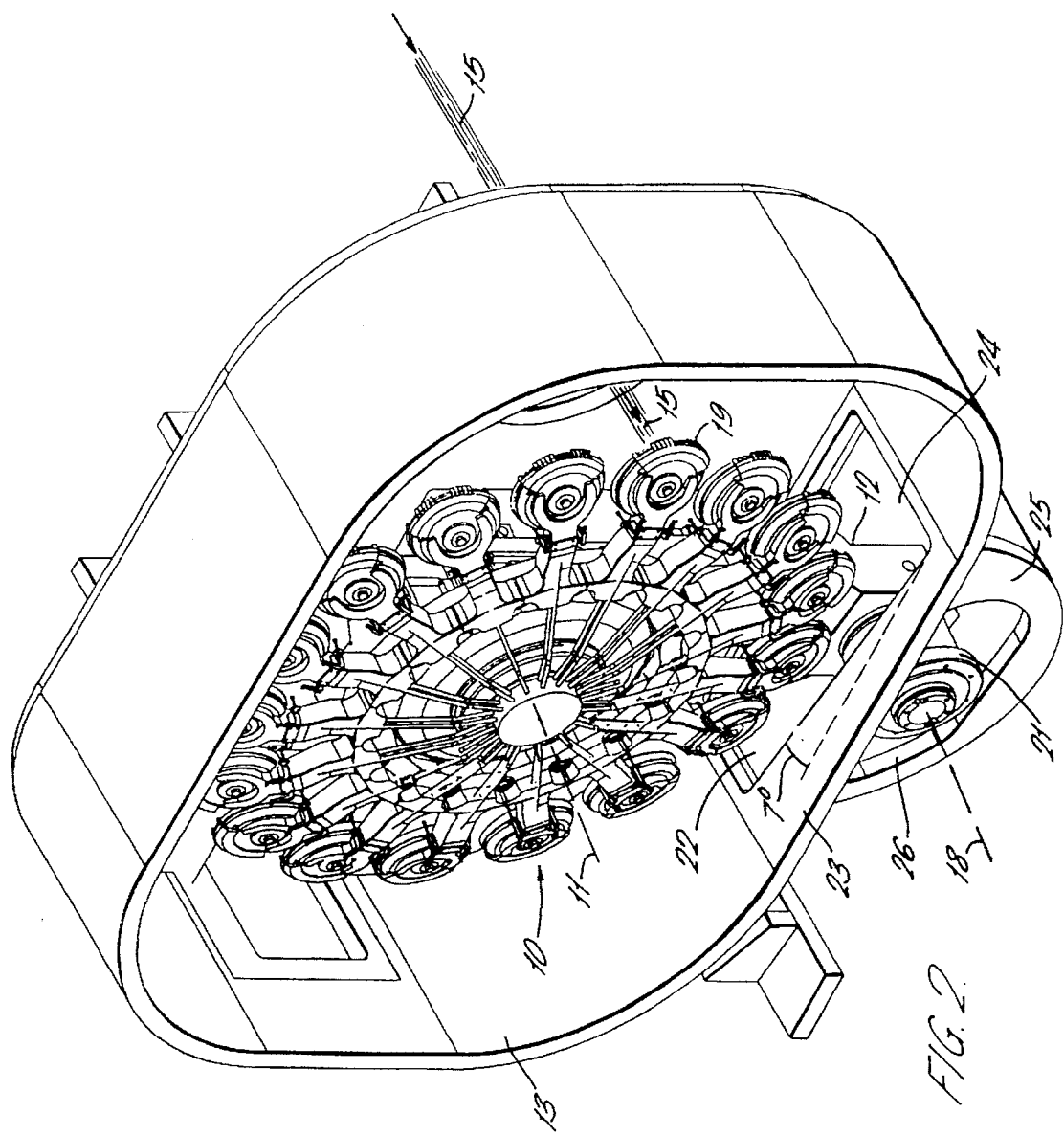
FIG. 2 is an isometric perspective view of the implant wheel in the vacuum chamber corresponding to FIG. 1.

FIGS. 1 and 2 of the drawings show the wafer processing chamber of an ion implantation apparatus. In a complete ion implantation machine a beam of ions of the chemical species to be implanted in the wafer is extracted from an ion source. In typical ion implantation processes, the beam comprises ions of phosphorous $P^+$, arsenic $As^+$, or boron $B^+$. The ions in the beam are then accelerated or decelerated to a desired energy at which they are to be implanted in the wafer. Typically, also, the ion beam drawn from the ion source is first passed through a mass selection region to select from all the ions present in the beam those particular ions required for implantation. The ion source, the mass selection arrangement, and other parts of the beam line of a typical ion implantation apparatus are not shown in FIG. 1 and 2, which show only the final stage of the apparatus where the required ions impinge upon and become implanted in the wafer or wafers under treatment.

Thus, in FIGS. 1 and 2, an implant wheel 10 is shown mounted for rotation about an axis 11 (FIG. 2) on the free end of a scanning arm 12. The entire implant wheel 10 and scanning arm 12 are themselves mounted inside a vacuum chamber 13. In the drawings, the rear door of the vacuum chamber is removed to reveal the implant wheel and scanning arm within.

In a complete ion implantation machine, the required ion beam enters the vacuum chamber 13 through an entry port located in the centre of flange 14. In FIG. 1, the entry port is hidden behind a part of the implant wheel 10 and in FIG. 2 the entry port cannot be seen behind a wall part of the vacuum chamber 13. However, the general line of the beam of ions supplied to the vacuum chamber 13 is shown in FIG. 2 at 15. It will be understood by those experienced in this field that all sections of the implantation apparatus through which the ion beam travels are evacuated and so the portion of the beam outside the vacuum chamber 13 is also in an evacuated region.

The implant wheel comprises a number of radial spokes 16 each having a wafer carrier 17 at its outer extremity. Wafers for treatment are carried on the reverse faces of the carrier 17 as shown in FIG. 1. The wafer supporting faces on the carrier 17 are arranged to be angled slightly radially inwards relative to the axis of rotation of the wheel 10, so that on rotation, the wafers are pressed firmly against the faces through centrifugal force. The angle of the carrying faces of the carrier 17 to a plane perpendicular to the axis of rotation of the wheel is typically 7°.

It will be appreciated that as the wheel 10 rotates, the individual carriers 17 of the wheel 10 successively interrupt the ion beam 15 as they move past the region of the flange 14.

The ion beam 15 has dimensions transversely of the ion beam direction, which are considerably smaller than the diameters of the wafer supporting surfaces on the carrier 17, and of the wafers themselves. In order to ensure that all regions of a wafer are evenly exposed to the ion beam during the process, the wheel 10 is rotated at relatively high speed, and at the same time, the scanning arm 12 reciprocates to and fro about an axis 18 (FIG. 2). As a result of the reciprocating action of the scanning arm 12, the position of the wafer carrier 17 as they pass the region of the ion beam, represented by the wafer carrier 19 in FIGS. 1 and 2, is progressively translated to and fro in the direction of the arrows 20.

The scanning arm 12 is mounted for the reciprocating motion on a rotary seal 21, located in a well 22 extending through the floor 23 of the vacuum chamber 13. The well 22 has front and back walls 24 and 25. In FIGS. 1 and 2, the back wall 25 is broken away at 26 for illustrative purposes only so as to reveal the lower end of the scanning arm 12.

The back wall 25 of the well extends vertically downwards from the floor 23 of the chamber 13 but is angled at 7° to the transverse dimension of the vacuum chamber 13, as can be seen best in FIG. 2. Since the rotary seal 21 is mounted on the back wall 25 so that the scan axis 18 is perpendicular to the back wall 25, this axis 18 is angled at 7° to the direction of the ion beam 15. The implant wheel 10 is mounted for rotation on the scanning arm 12 so that the axis 11 of rotation of the implant wheel is also maintained in the same plane as the scanning axis 18. Thus, with the wheel axis 11 substantially horizontal as illustrated in FIG. 2, the wheel axis 11 is also at 7° to the beam direction. As a result, the wafer carrier 19 intersecting the beam 15 holds the wafer being implanted precisely normal to the beam direction. The angle of the back wall 25 of the well 22 cancels the angle of the carrying face of the carrier 19 when the carrier intersects the ion beam.

Figure 3:
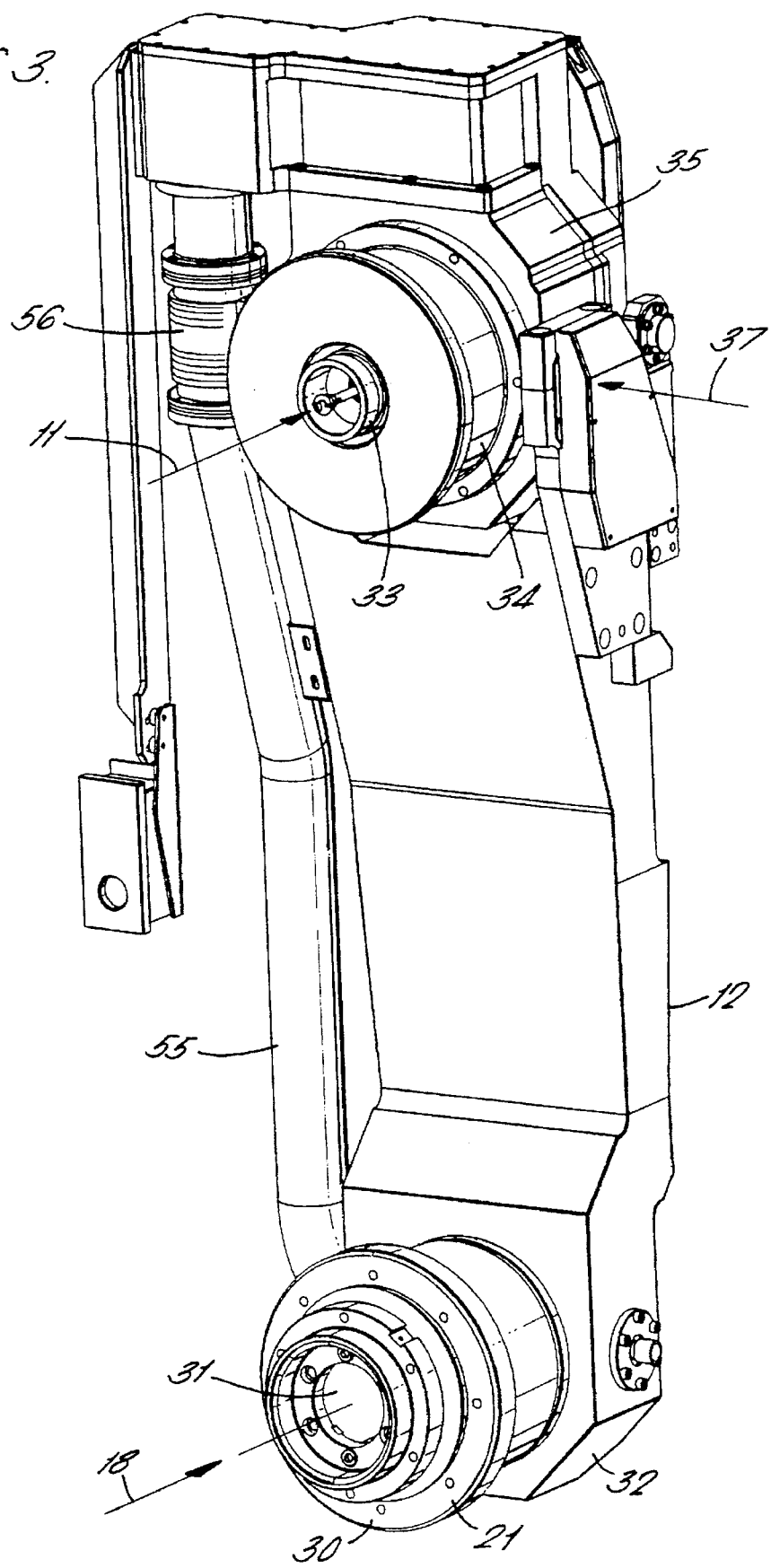
FIG. 3 is an isometric perspective view from the rear and one side of the scanning arm employed to support and scan the implant wheel illustrated in FIGS. 1 and 2.
Figure 4:
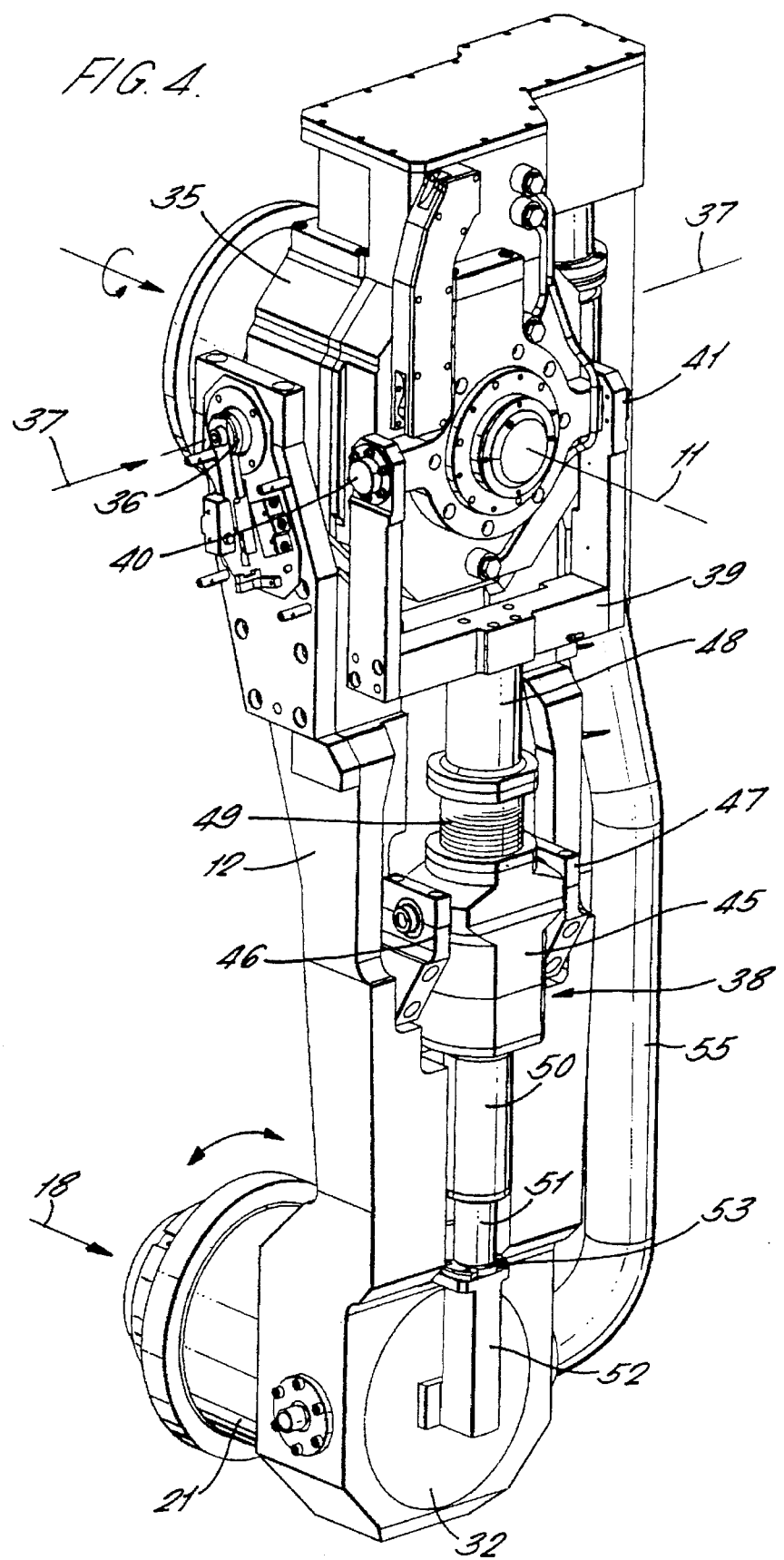
FIG. 4 is an isometric perspective view of the scanning arm of FIG. 3 from the front and side.

Referring now to FIGS. 3 and 4, these illustrate the scanning arm 12 with the implant wheel removed for clarity. The rotary vacuum seal 21 is shown connected to the bottom end of the scanning arm 12. The vacuum seal 21 includes a flange 30 for connection of the vacuum seal in an aperture in the rear wall 25 of the well 22 described above. The rotary vacuum seal may comprise a ferro-fluidic seal or other forms of rotary seal known in this field. The rotary vacuum seal 21 permits the scanning arm 12 to rotate relative to the flange 30 about the scan axis 18. An open bore 31 is provided through the centre of the vacuum seal, communicating with the interior of a sealed enclosure 32 at the bottom end of the arm 12. The open bore 31 also permits services, such as electrical supply, connections to sensors, data leads, and also supply and return of cooling liquid, to be fed through the vacuum seal from outside the vacuum chamber 13 to the various facilities provided on the scanning arm and implant wheel.

At the upper end (in the Figures) of the scanning arm 12, a mounting hub 33 for the implant wheel is mounted on an implant wheel bearing forming part of a further rotary vacuum seal, shown generally at 34. Again this rotary vacuum seal may be a ferro-fluidic seal of the kind known for vacuum applications. The outer casing of the ferro-fluidic seal 34 is fixed to a further casing 35 containing an electric motor for driving the implant wheel. The motor casing 35 provides a vacuum sealed enclosure containing the rotor and stator of the motor.

The entire assembly comprising motor housing 35 with motor, and the rotary vacuum seal 34 (together in practice with the implant wheel itself mounted on the hub 33) is mounted by means of trunnion bearings shown generally at 36, so that the assembly can be tilted about an axis 37. The angle of tilt is controlled by a linear actuator, shown generally at 38, acting via a yoke 39 journaled to the motor housing 35 at bearing points 40 and 41. The bearing points 40 and 41 are spaced from the tilt axis 37 in a direction perpendicular to the line of action of the linear actuator 38, so that operation of the actuator 38 alters the angle of tilt of the motor housing 35, the rotary vacuum seal 34, and in practice, the entire implant wheel mounted on the hub 33.

The linear actuator 38 comprises an electric motor housed in a sealed casing 45. The motor drives a roller screw on a threaded rod. The casing 45 with the motor and captive nut are journaled between thrust brackets 46 and 47 mounted on the scanning arm 12. The threaded rod driven by the actuator motor is integral with or fastened to an actuator rod 48 which is in turn connected to the yoke 39. Movement of the actuator rod 48 relative to the casing 45 is accommodated by a bellows seal 49.

The casing 45 includes an extension 50 to which is connected a short length of pipe 51. The pipe 51 is in turn connected to a square section conduit 52 fastened to and communicating with the rotating part of the rotary vacuum seal 21. The connection between the pipe section 51 and the square section conduit 52 is by means of a short bellows seal 53, which can accommodate the small rotational movement of the actuator housing 45 about the journal axis in the thrust brackets 46 and 47, as the actuator rod 48 and yoke 39 move up or down to adjust the tilt of the implant wheel.

The square section conduit 52 allows the sealed interior of the casing 45 to communicate through the rotary vacuum seal 21 with atmosphere outside the vacuum enclosure 13.

A further discreet pipe 55 provides atmospheric pressure communication between the interior of the implant wheel motor housing 35 and ambient atmosphere, again by communicating through the rotary vacuum seal 21. The pipe 55 is linked to the motor housing 35 by a bellows seal 56, to accommodate movement of the housing 35 as the tilt of the implant wheel is changed.

Figure 5:
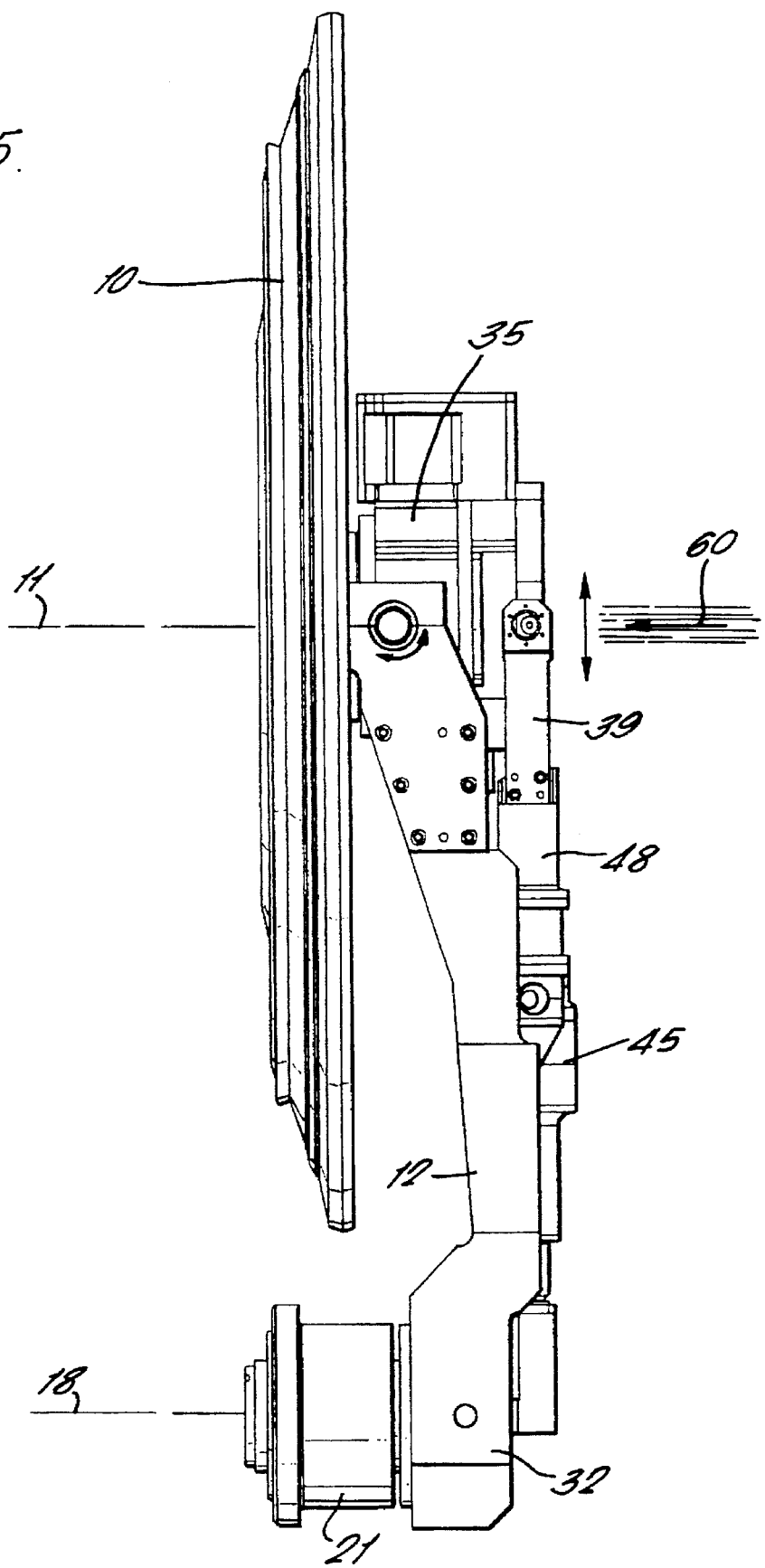
FIG. 5 is a side view in elevation of the scanning arm and implant wheel assembly, with the implant wheel in the central tilt position.
Figure 6:
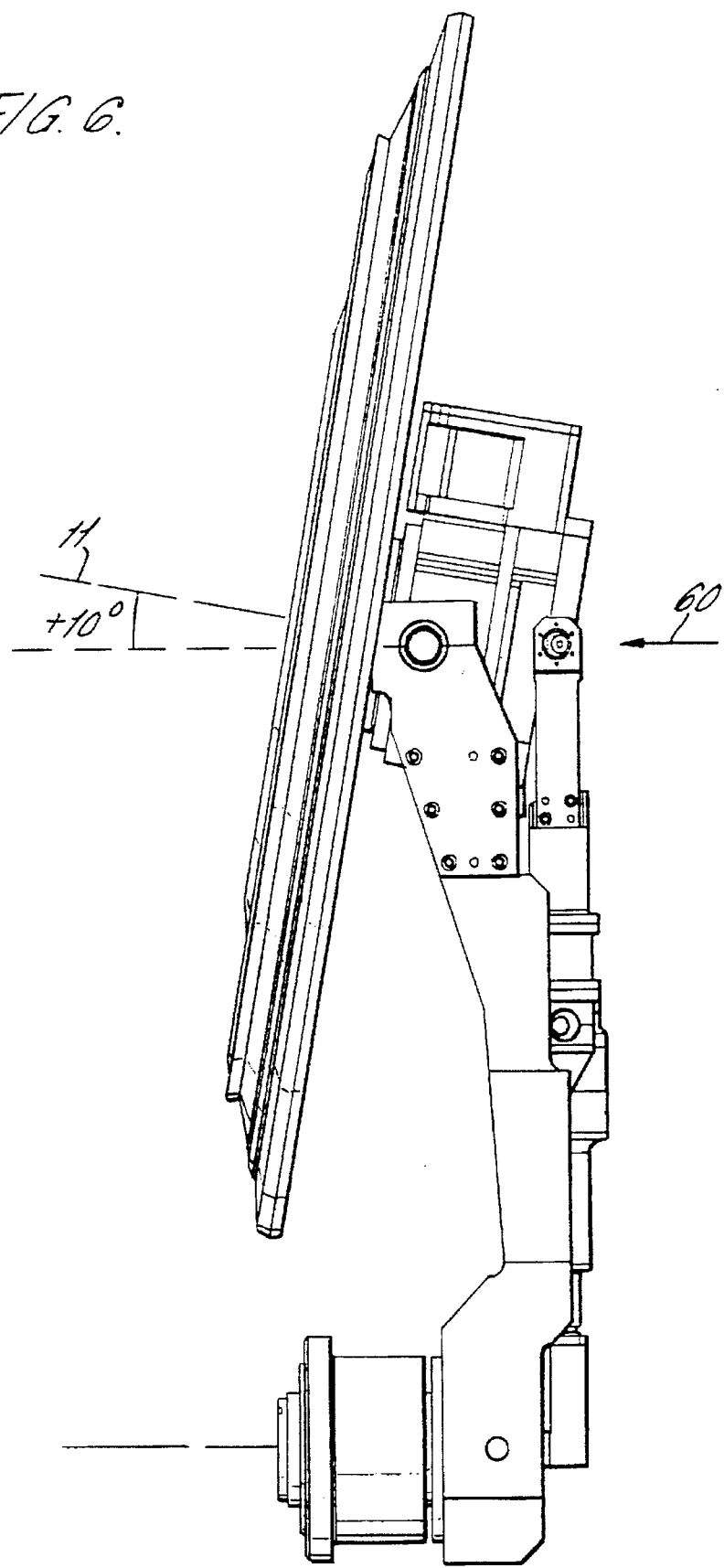
FIG. 6 is a side view in elevation of the implant wheel and scanning arm of FIG. 5, showing the scanning wheel tilted to the +10° position.
Figure 7:
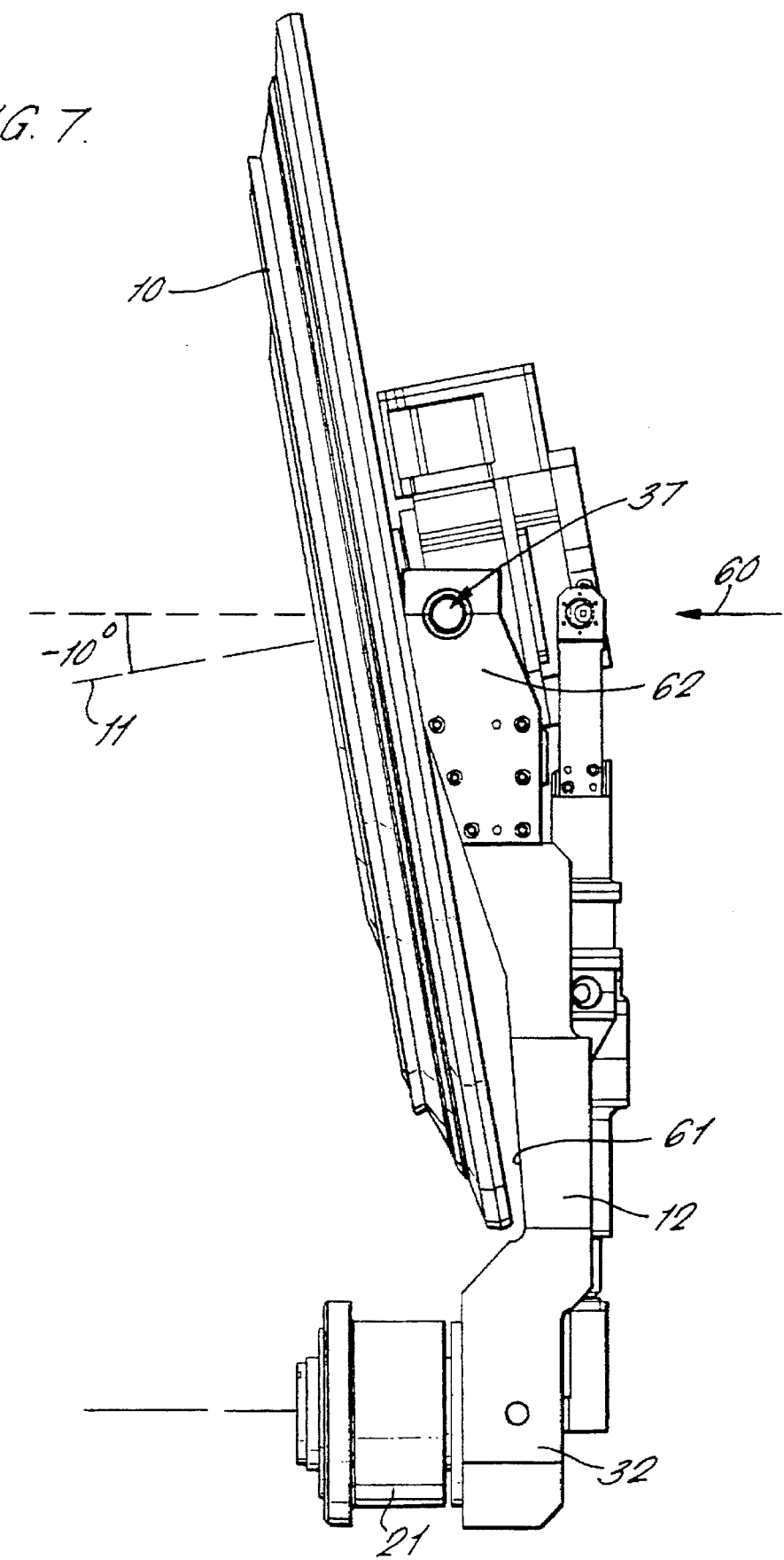
FIG. 7 is a side view in elevation of the implant wheel and scanning arm of FIGS. 5 and 6 with the implant wheel tilted to the −10° position.

The purpose of the adjustable implant wheel tilt provided by the mounting of the wheel bearing and wheel drive motor and the linear actuator mechanism 38, can best be understood by reference to FIGS. 5, 6 and 7. In FIG. 5, the scanning arm 12 is illustrated in elevation from one side with the implant wheel mounted on the hub 33 of the rotary vacuum seal. In FIG. 5, the arm 12 is illustrated with the wheel set at zero tilt angle, that is to say so that the axis of rotation 11 of the wheel 10 is parallel to the tilt axis 18. In this position, the ion beam, represented by the arrow 60 impinges on the wafer carried by the respective carrier 19, precisely normal to the plane of the wafer.

FIG. 6 illustrates the assembly of FIG. 5 with the implant wheel tilted to a maximum tilt angle of +10°. In this arrangement, the ion beam 60 impinges on the respective wafer at an implant angle of +10°.

FIG. 7 illustrates the assembly with the implant wheel at a maximum tilt in the opposite direction of −10°. In this case, the ion beam impinges on the respective wafer with an implant angle of −10°.

It will be understood that the tilt angle may be set by the mechanism described previously to any intermediate angle as required for the implantation process.

It can be seen from FIG. 7 that the tilt axis is mounted close to the plane of rotation of the wafer carrying positions on the implant wheel 10. As a result, the centre of rotation of the wafers, during processing, remains close to the horizontal plane containing the centre of the ion beam 60, for various angles of tilt. In order to accommodate the implant wheel 10 when the angle of tilt is set to a substantial negative value, as shown in FIG. 7, the scanning arm 12 is cut away at 61 between the lower end 32 mounted on the rotary seal 21 and the upper end 62 carrying the tilt bearings for the motor and wheel assembly. In fact as illustrated in FIG. 7, the scanning arm 12 is substantially cranked to accommodate the implant wheel 10.

The described scanning arrangement enables full tilt angle adjustment for the scanning wheel between + and −10° whilst maintaining convenient rotary vacuum seal mounting of the scanning arm.

What is claimed is:

1. Ion implantation apparatus comprising
   a) a vacuum chamber,
   b) an ion beam generator to generate an ion beam in the vacuum chamber,
   c) an implant wheel, in the vacuum chamber, having a plurality of circumferentially distributed substrate holding positions,
   d) a scanning arm mounted for reciprocal movement about a scan axis and having a free end supporting said implant wheel for rotation about a wheel axis, so that rotation of said implant wheel about said wheel axis brings the substrate holding positions successively to intercept the ion beam and reciprocation of said scanning arm about said scan axis scans the ion beam across the substrate holding positions,
   e) a rotary vacuum seal on said scan axis to mount said scanning arm for said reciprocating movement,
   f) a scan arm drive motor mounted outside said vacuum chamber to drive said scan arm through said rotary vacuum seal on said scan axis,
   g) a wheel bearing carrying said implant wheel for rotation about said wheel axis,
   h) a wheel tilt mechanism located in said vacuum chamber and including a tilt bearing mounting said wheel bearing to said free end of the scanning arm such that said wheel axis can be tilted relative to said scanning arm about a tilt axis, and a tilt actuator operable to set the wheel axis to a desired angle of tilt, and i) a wheel drive motor mounted in the vacuum chamber coaxially with said wheel.

2. Implantation apparatus as claimed in claim 1, wherein said tilt bearing is such that said tilt axis is perpendicular to said wheel axis.

3. Implantation apparatus as claimed in claim 2, wherein said tilt bearing is such that said wheel axis is always in the same plane as said scan axis, said tilt axis being perpendicular to said plane.

4. Implantation apparatus as claimed in claim 1, wherein said wheel bearing has an outer bearing housing and said wheel drive motor has an outer motor housing fixed relative to said outer bearing housing.

5. Implantation apparatus as claimed in claim 4, wherein said outer motor housing defines a sealed motor enclosure for the motor stator and rotor, and the apparatus includes a gas duct connecting said sealed motor enclosure to atmosphere.

6. Implantation apparatus as claimed in claim 5, wherein said motor enclosure gas duct connects to atmosphere through said rotary vacuum seal on said scan axis.

7. Implantation apparatus as claimed in claim 5, wherein said gas duct comprises a discreet pipe located adjacent to and extending the length of said scanning arm, said duct having a flexible coupling to said motor enclosure.

8. Implantation apparatus as claim in claim 3, wherein said tilt bearing is arranged to provide said tilt axis substantially intersecting said wheel axis.

9. Implantation apparatus as claimed in claim 8, wherein said tilt actuator comprises a linear actuator mounted in the vacuum chamber between a first point on said scanning arm between said scan axis and said tilt axis and a second point fixed relative to said wheel bearing at a location spaced from said tilt axis in a direction normal to the line of action of said linear actuator.

10. Implantation apparatus as claimed in claim 9, wherein said linear actuator comprises an electric actuator motor driving a roller screw on a threaded rod, an actuator housing defining a sealed actuator enclosure for said actuator motor and said nut, and a gas duct connecting said sealed actuator enclosure to atmosphere.

11. Implantation apparatus as claimed in claim 10, wherein said actuator enclosure gas duct corrects to atmosphere through said rotary vacuum seal on said scan axis.

* * * * *